United States Patent
Rode et al.

(10) Patent No.: US 8,319,250 B2
(45) Date of Patent: Nov. 27, 2012

(54) RADIATION-EMITTING SEMICONDUCTOR CHIP

(75) Inventors: Patrick Rode, Regensburg (DE); Lutz Hoeppel, Alteglofsheim (DE); Karl Engl, Niedergebraching (DE); Tony Albrecht, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/991,864

(22) PCT Filed: Apr. 17, 2009

(86) PCT No.: PCT/DE2009/000546
§ 371 (c)(1),
(2), (4) Date: Feb. 1, 2011

(87) PCT Pub. No.: WO2009/135457
PCT Pub. Date: Nov. 12, 2009

(65) Prior Publication Data
US 2011/0272728 A1    Nov. 10, 2011

(30) Foreign Application Priority Data
May 9, 2008 (DE) .................... 10 2008 022 942

(51) Int. Cl.
*H01L 33/38* (2010.01)
(52) U.S. Cl. ............ 257/99; 257/E33.001; 257/E33.062
(58) Field of Classification Search ............ 257/99, 257/E33.001, E33.062
See application file for complete search history.

(56) References Cited

U.S. PATENT DOCUMENTS

| 7,064,353 | B2 | 6/2006 | Bhat | |
|---|---|---|---|---|
| 7,105,860 | B2 | 9/2006 | Shei et al. | |
| 7,693,201 | B2 | 4/2010 | Albrecht et al. | |
| 8,084,775 | B2* | 12/2011 | Hasnain et al. | 257/93 |
| 2002/0179914 | A1 | 12/2002 | Sheu | |
| 2003/0189201 | A1 | 10/2003 | Chen | |
| 2005/0205887 | A1* | 9/2005 | Shei et al. | 257/99 |
| 2006/0060880 | A1 | 3/2006 | Lee et al. | |
| 2007/0069218 | A1 | 3/2007 | Chen | |
| 2007/0262335 | A1 | 11/2007 | Kumei et al. | |
| 2008/0014662 | A1* | 1/2008 | Yabuki | 438/23 |
| 2009/0057692 | A1* | 3/2009 | Lee | 257/89 |
| 2010/0258834 | A1* | 10/2010 | Liu et al. | 257/98 |
| 2010/0270578 | A1* | 10/2010 | Sorg et al. | 257/99 |
| 2011/0260205 | A1* | 10/2011 | Moosburger et al. | 257/99 |
| 2011/0272728 | A1* | 11/2011 | Rode et al. | 257/99 |

FOREIGN PATENT DOCUMENTS
CN          1564333         1/2005
(Continued)

OTHER PUBLICATIONS

I. Schnitzer et al., "30% external quantum efficiency from surface textured, thin-film light-emitting diodes", Appl. Phys. Lett. vol. 63, No. 18, pp. 2174-2176, Oct. 1993.

*Primary Examiner* — George Fourson, III
(74) *Attorney, Agent, or Firm* — Cozen O'Connor

(57) ABSTRACT

A radiation-emitting semiconductor chip (1) is provided, which comprises a carrier (5), a semiconductor body (2) with a semiconductor layer sequence, a first contact (35) and a second contact (36). The semiconductor layer sequence comprises an active region (20) provided for generating radiation, which is arranged between a first semiconductor layer (21) and a second semiconductor layer (22). The carrier (5) comprises a major surface (51) facing the semiconductor body (2). The first semiconductor layer (21) is arranged on the side of the active region (20) facing the major surface (51) of the carrier (5) and is electrically contactable by means of the first contact (35). The second semiconductor layer (22) is electrically contactable by means of the second contact (36). A protection diode (4) is formed in a current path extending between the first contact (35) and the second contact (36) through the carrier (5).

17 Claims, 2 Drawing Sheets

FOREIGN PATENT DOCUMENTS

| | | |
|---|---|---|
| DE | 199 45 134 | 8/2003 |
| DE | 10 2004 005 269 | 9/2005 |
| DE | 10 2007 021 905 | 11/2007 |
| DE | 10 2007 022 947 | 10/2008 |
| EP | 1 577 958 | 9/2005 |
| EP | 1 816 686 | 11/2005 |
| JP | 11 251644 | 9/1999 |
| JP | 2006-228904 | 8/2006 |
| JP | 2007-157926 | 6/2007 |
| JP | 2007-201317 | 8/2007 |
| KR | 10 2006 0062715 | 6/2006 |
| WO | WO 01/22495 | 3/2001 |
| WO | WO 2008/131735 | 11/2008 |

\* cited by examiner

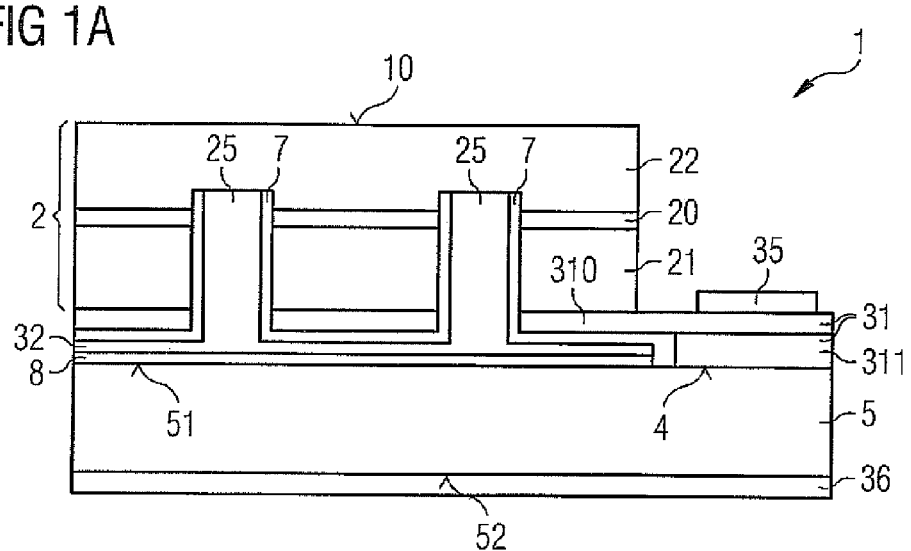
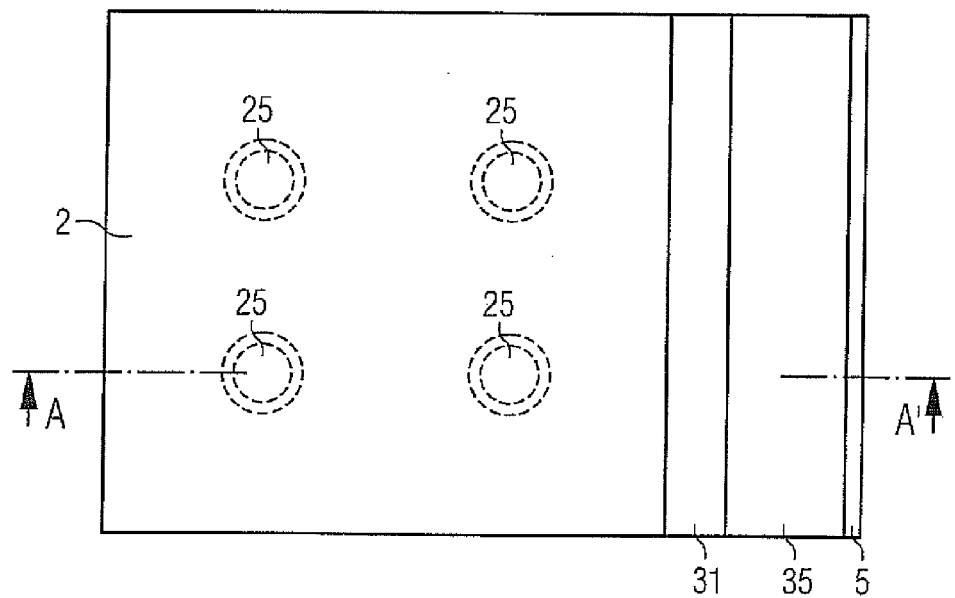

RADIATION-EMITTING SEMICONDUCTOR CHIP

RELATED APPLICATIONS

This is a U.S. national stage of application No. PCT/DE2009/000546 filed on Apr. 17, 2009.

This application claims the priority of German application no. 10 2008 022 942.3 filed May 9, 2008, the entire content of which is hereby incorporated by reference.

FIELD OF THE INVENTION

The present application relates to a radiation-emitting semiconductor chip.

BACKGROUND OF THE INVENTION

With radiation-emitting semiconductor chips, for instance light-emitting diodes, electrostatic discharge may lead to damage thereto or even destruction thereof. To prevent such damage, an additional diode may be connected in parallel with the semiconductor chip, the forward direction of the diode being oriented antiparallel to the forward direction of the radiation-emitting semiconductor chip. When the semiconductor chips are mounted, an additional diode is thus assigned thereto, which may make mounting very complex and lead to high manufacturing costs and increased space requirements.

SUMMARY OF THE INVENTION

An object is to provide a radiation-emitting semiconductor chip which displays reduced sensitivity to electrostatic discharge.

According to one embodiment a radiation-emitting semiconductor chip comprises a carrier, a semiconductor body with a semiconductor layer sequence, a first contact and a second contact. The semiconductor layer sequence comprises an active region provided for generating radiation, a first semiconductor layer and a second semiconductor layer. The active region is arranged between the first semiconductor layer and the second semiconductor layer. The carrier comprises a major surface facing the semiconductor body. The first semiconductor layer is arranged on the side of the active region facing the major surface of the carrier and is electrically contactable by means of the first contact. The second semiconductor layer is electrically contactable by means of the second contact. A protection diode is provided in a current path extending between the first contact and the second contact through the carrier.

In this embodiment the protection diode is integrated into the semiconductor chip. An undesired voltage, applied to the semiconductor chip for instance in the reverse direction thereof, may flow away via such a protection diode. The protection diode may in particular fulfil the function of an ESD (electrostatic discharge) diode, which protects the semiconductor chip from damage by electrostatic discharge. The risk of damage to the semiconductor chip may thus be reduced. An additional protection diode for arrangement outside the semiconductor chip and electrical connection therewith may be dispensed with.

In addition to the current path with the protection diode, the semiconductor chip conveniently comprises an injection path between the first contact and the second contact, which extends through the semiconductor body, in particular through the active region.

In a preferred configuration, the current path, in which the protection diode is provided, extends outside the semiconductor body. In other words, the charge carriers, which flow away via the protection diode between the contacts, do not flow through the semiconductor body.

The first semiconductor layer and the second semiconductor layer of the semiconductor body conveniently differ from one another with regard to their conduction type. For example, the first semiconductor layer may be p-conductive and the second semiconductor layer n-conductive or vice versa.

A diode structure in which the active region is formed is thus simply produced.

As far as the forward direction is concerned, the diode structure of the semiconductor body and the protection diode are preferably antiparallel to one another. An operating voltage applied to the diode structure in the forward direction between the first contact and the second contact effects the injection of charge carriers from different sides of the active region into the active region. In the active region the charge carriers may recombine with the emission of radiation.

In this case, no or at least no significant current flow takes place through the protection diode, which is operated in the reverse direction at the operating voltage of the semiconductor chip. In contrast, an electrical voltage applied to the diode structure in the reverse direction, for instance as a result of electrostatic charge, may flow away via the protection diode. Thus, the semiconductor body may be protected by the protection diode integrated into the semiconductor chip, without the optoelectronic characteristics of the semiconductor chip being significantly impaired.

In a further preferred configuration, the protection diode is formed by means of the carrier. In particular, the protection diode may be provided outside the semiconductor body. The semiconductor body may thus be provided solely to generate radiation. The protection diode may be integrated into the semiconductor chip in such a way that the area of the active region usable for radiation generation may be retained with the base area of the semiconductor chip being the same.

In a preferred configuration the semiconductor body is cohesively connected to the carrier. The carrier is different in particular from a growth substrate for the semiconductor layer sequence of the semiconductor body.

In the case of a cohesive connection, the joint components, which are preferably prefabricated, are held together by means of atomic and/or molecular forces. A cohesive connection may be achieved, for example, by means of a bonding layer, for instance an adhesive layer or a solder layer. As a rule, separation of the joint is accompanied by destruction of the bonding layer and/or at least of one of the joint components.

The carrier preferably extends vertically, i.e. perpendicularly to a main plane of extension of the semiconductor layers of the semiconductor body, between the major surface and a further major surface. The major surface of the carrier is preferably of planar construction. It is thus simple to achieve reliable fastening of the semiconductor body to the carrier. Furthermore, the further major surface is preferably of planar construction. The semiconductor chip may be mounted in simplified manner on the further major surface, for instance in a housing or on a connection carrier.

Furthermore, the carrier preferably contains a semiconductor material or consists of a semiconductor material. Silicon in particular has proven particularly suitable. Other semiconductor materials, for instance germanium or gallium arsenide, may be used as the material for the carrier as well.

In a further preferred configuration, the carrier is doped, at least in places. Formation of a protection diode by means of the carrier may in this way be simplified.

In a further preferred configuration the first contact is arranged on the major surface of the carrier. The first contact may be spaced from the active region in a lateral direction, i.e. in a direction extending along the main direction of extension of the semiconductor layers of the semiconductor body. The first semiconductor layer and the associated first contact may furthermore be arranged on the same side of the carrier.

In a preferred further development a first connection layer is arranged between the semiconductor body and the carrier.

The first semiconductor layer is conveniently connected electrically conductively to the first connection layer. Preferably, an ohmic contact is formed between the first connection layer and the first semiconductor layer, i.e. the current-voltage characteristic of the contact extends linearly or at least approximately linearly.

In a further preferred configuration the semiconductor body comprises at least one recess, which extends through the active region and which is provided for electrical contacting of the second semiconductor layer. In particular, the recess may extend from the side of the carrier through the active region.

In a preferred further development the second semiconductor layer is connected electrically conductively to a second connection layer, the second connection layer extending through the recess.

By means of the recess, the second semiconductor layer may be electrically contacted from the side of the active region facing the carrier.

A radiation exit face of the semiconductor chip, which is formed on the side of the active region remote from the carrier, may be free of an external electrical contact for the semiconductor body. Shading of the radiation exit face by a radiation-impermeable contact may thus be prevented. In this way, the first semiconductor layer and the second semiconductor layer may be electrically connected from the side of the active region facing the carrier.

In a preferred further development, the second connection layer is provided in places between the first connection layer and the carrier. An insulation layer is preferably provided between the first connection layer and the second connection layer.

In a further preferred development, the bonding layer is arranged between the second connection layer and the carrier.

The bonding layer covers the carrier preferably only in places. In particular, a region of the major surface of the carrier in which the protection diode is formed may be at least partially free of the bonding layer.

In a preferred configuration, the first contact and the second contact are arranged on opposite sides of the carrier. The current path, in which the protection diode is formed, may in this case extend vertically through the carrier.

In particular, the second contact may be arranged on the side of the carrier remote from the semiconductor body and moreover be provided for mounting of the radiation-emitting semiconductor chip, for instance in a housing body or on a connection carrier.

In a further preferred configuration, the protection diode is embodied as a Schottky diode. A Schottky diode may be formed in particular by means of a metal-semiconductor junction, wherein the current-voltage characteristic of the junction deviates from an ohmic characteristic.

Furthermore, the protection diode is preferably formed between the first contact and the carrier. In particular, the protection diode may be embodied as a metal-semiconductor junction, wherein the major surface of the carrier forms the metal-semiconductor junction. The major surface of the carrier may thus serve in places as an interface of a metal-semiconductor junction.

In a further preferred configuration, the first connection layer comprises an injection layer, which adjoins the semiconductor body, in particular the first semiconductor layer. The injection layer is preferably such that it produces an ohmic contact to the semiconductor body. The injection layer may also be of multilayer construction.

Furthermore, the injection layer or at least one sublayer of the injection layer adjoining the semiconductor body displays high reflectivity for the radiation generated in the active region. Radiation generated in the active region and emitted in the direction of the carrier may in this way be deflected towards the radiation exit face. The risk of the radiation being absorbed in the carrier may be avoided. Examples of suitable material with high reflectivity for radiation in the visible and ultraviolet spectral range are in particular silver, aluminium or rhodium, with gold being particularly suitable in the red and infrared spectral range.

The first connection layer preferably also comprises a transition layer, which adjoins the carrier.

In a preferred further development, the protection diode is formed by means of the first connection layer, in particular by means of the transition layer. In particular, the first connection layer may form a Schottky contact with the carrier.

The first connection layer may thus be such that it forms an ohmic contact to the semiconductor body, in particular to the first semiconductor layer, and a Schottky contact to the carrier. In other words, the first connection layer may on the one hand serve to produce an electrical contact to the semiconductor body and on the other hand to form the protection diode integrated into the semiconductor chip.

The first connection layer furthermore preferably is embodied as a continuous layer.

In a preferred further development, the protection diode overlaps with the first contact when the semiconductor chip is viewed in plan view. The protection diode may thus be formed in a region, when viewed in plan view, which is provided for external electrical contacting of the semiconductor chip, for instance by means of a bonding wire. In this way the protection diode may be formed in the semiconductor chip without additional space requirements. In particular, the protection diode may be integrated into the semiconductor chip outside the semiconductor body, without the area of the active region usable for radiation generation in the semiconductor chip being reduced.

The protection diode is also preferably provided, when the semiconductor chip is viewed in plan view, in a region in which the semiconductor body has been removed, in particular completely in the vertical direction.

When producing the semiconductor chip, the protection diode may be formed in that the carrier is exposed in places by removal of the semiconductor body and optionally of the bonding layer. In the exposed region material for the first connection layer, in particular for the transition layer, may be deposited on the major surface of the carrier. The protection diode is thus produced in a simple manner.

The semiconductor layer sequence of the semiconductor body is preferably deposited epitaxially, for instance by means of MOVPE or MBE.

Furthermore, the semiconductor body, in particular the active region, preferably contains a III-V semiconductor material. With III-V semiconductor materials high internal quantum efficiencies during radiation generation may be achieved.

The above-described structure is generally suitable for radiation-emitting semiconductor chips, wherein the semiconductor chips may be provided for generating incoherent, partially coherent or coherent radiation.

In a preferred configuration, the semiconductor chip is embodied as a light-emitting diode semiconductor chip, which is additionally preferably provided for generating incoherent or partially coherent radiation.

In a further preferred configuration a growth substrate for the semiconductor layer sequence of the semiconductor body has been removed. A semiconductor chip in which the growth substrate has been removed is also referred to as a thin-film semiconductor chip.

A thin-film semiconductor chip, for instance a thin-film light-emitting diode semiconductor chip, may furthermore be distinguished for the purposes of the present application by at least one of the following characteristic features:

- on a first major surface, facing the carrier, of a semiconductor body comprising a semiconductor layer sequence with an active region, in particular of an epitaxial layer sequence, a mirror layer is applied or formed, for instance integrated as a Bragg mirror in the semiconductor layer, said mirror layer reflecting back into the semiconductor layer sequence at least some of the radiation generated in said sequence;
- the semiconductor layer sequence has a thickness in the range of 20 µm or less, in particular in the range of 10 µm; and/or
- the semiconductor layer sequence contains at least one semiconductor layer with at least one face which comprises an intermixing structure, which ideally leads to an approximately ergodic distribution of the light in the semiconductor layer sequence, i.e. it exhibits scattering behaviour which is as ergodically stochastic as possible.

The basic principle of a thin-film light-emitting diode chip is described for example in I. Schnitzer et al., Appl. Phys. Lett. 63 (16), 18 Oct. 1993, 2174-2176, whose disclosure content is hereby included by reference in this respect in the present application.

BRIEF DESCRIPTION OF THE DRAWINGS

FIGS. 1A and 1B show an exemplary embodiment of a radiation-emitting semiconductor chip in schematic plan view (FIG. 1B) and associated sectional view (FIG. 1A)

DETAILED DESCRIPTION OF THE DRAWINGS

Figure 2:
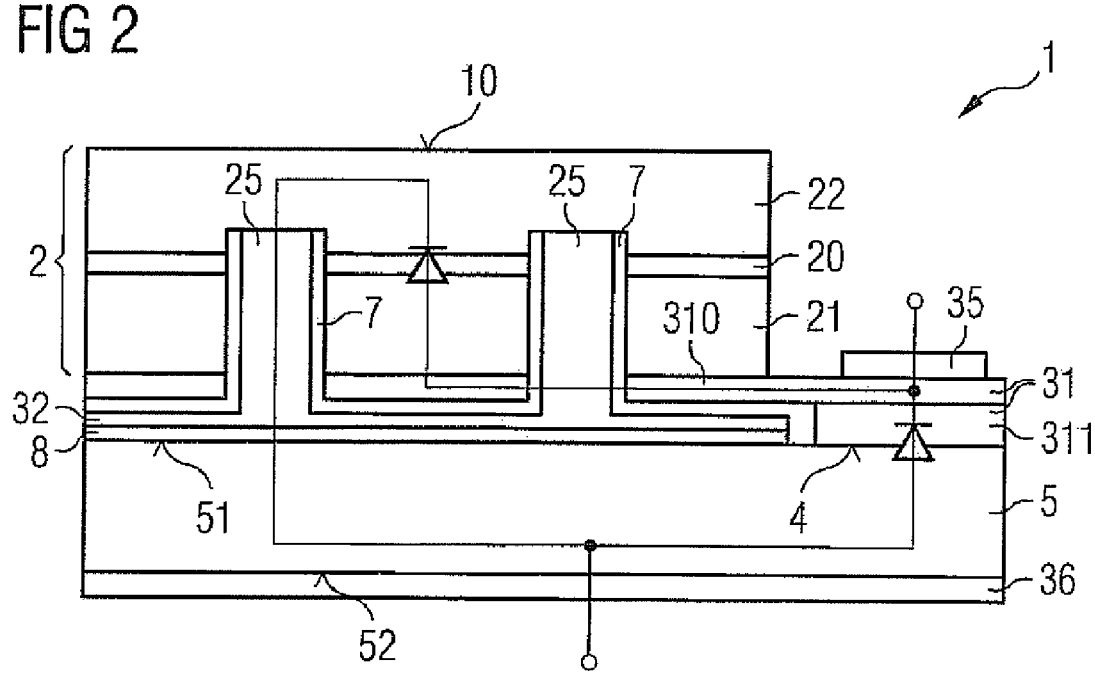
FIG. 2 is a schematic representation of the current paths in a semiconductor chip according to the exemplary embodiment shown in FIGS. 1A and 1B.

Identical, similar and identically acting elements are provided with identical reference numerals in the Figures.

The Figures are in each case schematic representations and are therefore not necessarily true to scale. Rather, comparatively small elements and in particular layer thicknesses may be illustrated on an exaggeratedly large scale for clarification.

FIG. 1B is a schematic plan view of an exemplary embodiment of a radiation-emitting semiconductor chip 1 and FIG. 1A shows an associated schematic sectional view along line AA'. The semiconductor chip 1 comprises a semiconductor body 2 with a semiconductor layer sequence. The semiconductor layer sequence forms the semiconductor body 2 and is preferably produced epitaxially, for instance by means of MOVPE or MBE.

Furthermore, the radiation-emitting semiconductor chip 1 comprises a carrier 5 with a major surface 51 and a further major surface 52 opposite the major surface.

The semiconductor body 2 is arranged on the major surface 51 of the carrier 5 and cohesively connected to the carrier 5 by means of a bonding layer 8. The bonding layer may for example be a solder layer or an electrically conductive adhesive layer.

The carrier 5 contains a semiconductor material or consists of a semiconductor material. In particular, the carrier 5 may contain silicon or consist of silicon. Another semiconductor material, for instance germanium or gallium arsenide, may also be used as carrier material.

The semiconductor layer sequence of the semiconductor body 2 comprises an active region 20 provided for generating radiation, said active region being arranged between a first semiconductor layer 21 and a second semiconductor layer 22. The first semiconductor layer 21 is arranged on the side of the active region facing the carrier 5.

Furthermore, the semiconductor chip 1 comprises a first contact 35 and a second contact 36. By applying an external electrical voltage between the first contact and the second contact, it is possible for charge carriers to be injected from different sides of the active region 20 into the latter when the semiconductor chip is in operation and there to recombine with the emission of radiation.

A protection diode 4 is formed in a current path, which extends through the carrier 5 between the first contact 35 and the second contact 36. The mode of operation of the protection diode is described in greater detail with reference to FIG. 2.

The semiconductor body 2 comprises recesses 25, which extend through the first semiconductor layer 21 and the active region 20 into the second semiconductor layer 22. The recesses are provided for electrical contacting of the second semiconductor layer 22 from the side of the active region facing the carrier 5. The density and the arrangement of the recesses are conveniently selected in such a way that injection of the charge carriers via the second semiconductor layer 22 into the active region proceeds uniformly in a lateral direction. A matrix-like arrangement of the recesses is suitable for this purpose, for example.

On the side of the active region 20 remote from the carrier 5, the semiconductor body 2 comprises a radiation exit face 10, through which radiation generated in the active region 20 when the semiconductor chip is in operation may escape.

The radiation exit face 10 is free of an external electrical contact for the semiconductor chip 1. The risk of shading of the radiation exit face by a contact which is not transparent to radiation generated in the active region 20 may thus be avoided. The total radiant power emerging from the semiconductor chip may thus be increased.

The first contact 35 is connected electrically conductively to the first semiconductor layer 21 via a first connection layer 31. The first connection layer 31 is arranged between the semiconductor body 2 and the carrier 5. The connection layer 31 preferably forms an ohmic contact to the first semiconductor layer 21, such that charge carriers may be efficiently injected into the semiconductor body 2.

In the exemplary embodiment shown the first connection layer 31 is of multilayer construction. On the side facing the semiconductor body 2 the first connection layer comprises an injection layer 310. The injection layer 310 is preferably such that it produces an ohmic contact to the first semiconductor layer 21.

The injection layer 310 may also be of multilayer construction. On the side facing the first semiconductor layer 21 the injection layer preferably displays high reflectivity for the radiation generated in the active region 20. In the ultraviolet and blue spectral range silver is for example suitable, in the red and infrared spectral range for example gold.

Furthermore, the first connection layer 31, in particular the injection layer 310, may fulfil the function of a diffusion barrier and for example contain titanium and/or platinum.

The first connection layer 31 comprises a transition layer 311 adjoining the carrier 5. The transition layer 311 forms a Schottky contact with the major surface 51 of the carrier 5. The material of the transition layer is conveniently matched to the carrier 5 in such a way that a Schottky contact may be simply produced. In the case of a silicon carrier, aluminum is for example suitable for the transition layer.

Furthermore, a second connection layer 32 is formed between the carrier 5 and the semiconductor body 2. This second connection layer 32 extends through the recesses 25 as far as the second semiconductor layer 22. The bonding layer 8 is arranged on the side of the second connection layer 32 remote from the semiconductor body 2. An electrically conductive connection is produced between the second semiconductor layer 22 and the carrier 5 by way of the bonding layer 8.

The side faces of the recesses 25 are covered with an insulation layer 7. By means of this insulation layer, electrical short-circuiting of the active region 20 by the second connection layer 32 may be prevented. The insulation layer 7 additionally extends between the first connection layer 31 and the second connection layer 32 and isolates these connection layers electrically from one another.

The insulation layer 7 may for example contain an oxide, for instance silicon oxide or titanium oxide, a nitride, for instance silicon nitride, or an oxynitride, for instance silicon oxynitride or consist of such a material.

The first connection layer 31, in particular the injection layer 310 and the transition layer 311, the second connection layer 32, the first contact 35 and the second contact 36 preferably in each case contain a metal or consist of a metal or a metallic alloy. The stated layers arranged outside the semiconductor body 2 may be applied for example by means of vapour deposition or sputtering.

The first contact 35 and the second contact 36 are arranged on different sides of the carrier 5. The first contact 35 may be electrically contacted externally for example by means of a bonding wire. Unlike in the exemplary embodiment illustrated, the first contact 35 may also be formed by means of the first connection layer 31. A separate contact provided in addition to the first connection layer 31 is thus not necessary in this case.

The protection diode 4 in the current path between the first contact 35 and the second contact 36 is embodied as a Schottky diode, which is formed on the major surface 51 of the carrier 5. In the region of the protection diode 4 a metal-semiconductor junction exists between the carrier 5 and the first connection layer 31, in particular between the carrier 5 and the transition layer 311.

The protection diode 4 is thus formed in a region in which the semiconductor body 2 has been removed completely in the vertical direction.

The carrier 5 preferably comprises the same conduction type as the second semiconductor layer 22. Electrical contacting of the second semiconductor layer 22 through the carrier 5 is thus simplified.

The first semiconductor layer 21 and the second semiconductor layer 22 conveniently differ from one another with regard to their conduction type. A diode structure in which the active region 20 is formed is thus simply produced. In the exemplary embodiment illustrated in FIGS. 1A, 1B and 2, merely by way of example the first semiconductor layer 21 is p-conductively doped and the second semiconductor layer 22 is n-conductively doped, as is the carrier 5.

With regard to the forward direction, the protection diode 4 is formed antiparallel to the forward direction of the diode structure of the semiconductor body 2. The current paths in the semiconductor chip 1 are illustrated schematically in FIG. 2. When applying a positive electrical voltage to the first contact 35 relative to the second contact 36, the diode structure of the semiconductor body 2 provided to generate radiation is operated in the forward direction, such that charge carriers are injected into the active region 20 and may there recombine with the emission of radiation.

With this polarity, the protection diode 4 is on the other hand connected in the reverse direction. In the case of electrostatic charging of the diode structure of the semiconductor body in the reverse direction, however, charge carriers may flow away via the protection diode 4 by way of the current path between the first contact 35 and the second contact 36. The risk of damage to the semiconductor chip may thus be reduced. It is possible to dispense with a protection diode formed outside the semiconductor chip and connected antiparallel to the first contact 35 and second contact 36 of the semiconductor chip.

Alternatively, if the first semiconductor layer 21 is n-conductively doped and the second semiconductor layer 22 and the carrier 5 are p-conductively doped, the semiconductor chip may accordingly be operated such that a negative voltage is applied to the first contact 35 relative to the second contact 36.

With the connection layer 31 it is possible on the one hand to produce an ohmic contact to the semiconductor body 2 and on the other hand a Schottky contact to the carrier 5. The protection diode may thus also be formed by means of the first connection layer 31 provided for electrical contacting of the semiconductor body 2.

The protection diode 4 may here be formed under the first contact 35, when the semiconductor chip is viewed in plan view. The protection diode may thus be integrated into the semiconductor chip 1 without the need for additional surface area. Furthermore, the protection diode 4 is arranged outside the semiconductor body 2. The epitaxially grown semiconductor body may thus be provided solely to generate radiation. The protection diode may thus be integrated into the semiconductor chip, without the area of the active region usable for radiation generation being reduced.

Furthermore, the protection diode 4 may be formed during production of the semiconductor chip 1 while still in assembly form. This means that, when the assembly is singulated semiconductor chips emerge with semiconductor bodies in each case arranged on a carrier, the protection diode being already formed in the semiconductor chips. A semiconductor chip with integrated protection diode may in this way be produced particularly cost-effectively.

In addition, the above-described semiconductor chip with integrated protection diode requires little mounting surface area in comparison with a semiconductor chip with additional external protection diode. The production of a compact component with such a semiconductor chip as radiation source is thus simplified. It is furthermore possible to avoid the risk of the separate protection diode causing absorption of the radiation generated in the active region.

In the exemplary embodiment shown, the semiconductor chip 1 is embodied as a thin-film semiconductor chip, in which a growth substrate for the semiconductor layer sequence of the semiconductor body 2 has been removed. The carrier 5 here serves in particular in mechanical stabilisation of the semiconductor body 2.

On the other hand, the growth substrate body may also be removed only in places.

The semiconductor body, in particular the active region 20, preferably contains a III-V semiconductor material.

III-V-semiconductor materials are particularly suitable for generating radiation in the ultraviolet ($In_xGa_yAl_{1-x-y}N$) through the visible ($In_xGa_yN$, in particular for blue to green radiation, or $In_xGa_yAl_{1-x-y}P$, in particular for yellow to red radiation) to the infrared ($In_xGa_yAl_{1-x-y}As$) range of the spectrum. Here in each case $0 \leq x \leq 1$, $0 \leq y \leq 1$ and $x+y \leq 1$ applies, in particular with $x \neq 1$, $y \neq 1$, $x \neq 0$ and/or $y \neq 0$. Furthermore, high internal quantum efficiencies in the generation of radiation may be achieved using III-V semiconductor materials, in particular from the stated material systems.

This patent application claims priority from German patent application 10 2008 022 942.3, whose disclosure content is hereby included by reference.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A radiation-emitting semiconductor chip, comprising:
a semiconductor body having a semiconductor layer sequence comprising an active region for generating radiation, said active region being arranged between a first semiconductor layer and a second semiconductor layer;
a carrier comprising a major surface facing the semiconductor body;
a first contact;
a second contact; and
a protection diode formed in a current path extending between the first contact and the second contact through the carrier, the protection diode being a Schottky diode formed between the first contact and the carrier;
wherein the first semiconductor layer is arranged on a side of the active region facing the major surface of the carrier and is electrically contactable by the first contact; and
wherein the second semiconductor layer is electrically contactable by the second contact.

2. The semiconductor chip according to claim 1, wherein the protection diode is embodied as a metal-semiconductor junction, and wherein the major surface forms the metal-semiconductor junction.

3. The semiconductor chip according to claim 1, wherein the semiconductor body is cohesively connected to the carrier.

4. The semiconductor chip according to claim 1, wherein the first contact is arranged on the major surface of the carrier.

5. The semiconductor chip according to claim 1, wherein the first contact and the second contact are arranged on opposing sides of the carrier.

6. The semiconductor chip according to claim 1, wherein a first connection layer is arranged between the semiconductor body and the carrier; and wherein the first semiconductor layer is connected electrically conductively with the first connection layer.

7. The semiconductor chip according to claim 6, wherein the first connection layer comprises an injection layer and a transition layer, the injection layer adjoining the semiconductor body and the transition layer adjoining the carrier.

8. The semiconductor chip according to claim 7, wherein the protection diode is formed by the transition layer.

9. The semiconductor chip according to claim 1, wherein the semiconductor body comprises at least one recess extending through the active region and provided for electrical contacting the second semiconductor layer.

10. A radiation-emitting semiconductor chip, comprising:
a semiconductor body having a semiconductor layer sequence comprising an active region for generating radiation, said active region being arranged between a first semiconductor layer and a second semiconductor layer;
a carrier comprising a major surface facing the semiconductor body;
a first contact;
a second contact; and
a protection diode formed in a current path extending between the first contact and the second contact through the carrier;
wherein the first semiconductor layer is arranged on a side of the active region facing the major surface of the carrier and is electrically contactable by the first contact;
wherein the second semiconductor layer is electrically contactable by the second contact; and
wherein the semiconductor body comprises at least one recess extending through the active region and provided for electrical contacting the second semiconductor layer.

11. The semiconductor chip according to claim 10, wherein the second semiconductor layer is connected electrically conductively to a second connection layer; and wherein the second connection layer extends through the recess.

12. The semiconductor chip according to claim 11, wherein a first connection layer is arranged between the semiconductor body and the carrier;
wherein the first semiconductor layer is connected electrically conductively with the first connection layer; and
wherein the second connection layer is formed in places between the first connection layer and the carrier.

13. The semiconductor chip according to claim 1, wherein the protection diode overlaps with the first contact when the semiconductor chip is viewed in plan view.

14. The semiconductor chip according to claim 1, wherein the carrier contains a semiconductor material.

15. The semiconductor chip according to claim 1, wherein a growth substrate for the semiconductor layer sequence of the semiconductor body has been removed.

16. A radiation-emitting semiconductor chip, comprising:
a semiconductor body having a semiconductor layer sequence comprising an active region for generating radiation, said active region being arranged between a first semiconductor layer and a second semiconductor layer;
a carrier comprising a major surface facing the semiconductor body;
a first contact;
a second contact; and
a protection diode formed in a current path extending between the first contact and the second contact through the carrier;
wherein the first semiconductor layer is arranged on a side of the active region facing the major surface of the carrier and is electrically contactable by the first contact;
wherein the second semiconductor layer is electrically contactable by the second contact; and wherein the first contact is arranged on the major surface of the carrier.

17. A radiation-emitting semiconductor chip, comprising:

a semiconductor body having a semiconductor layer sequence comprising an active region for generating radiation, said active region being arranged between a first semiconductor layer and a second semiconductor layer;

a carrier comprising a major surface facing the semiconductor body;

a first contact;

a second contact; and a protection diode formed in a current path extending between the first contact and the second contact through the carrier;

wherein the first semiconductor layer is arranged on a side of the active region facing the major surface of the carrier and is electrically contactable by the first contact;

wherein the second semiconductor layer is electrically contactable by the second contact;

wherein a first connection layer is arranged between the semiconductor body and the carrier;

wherein the first semiconductor layer is connected electrically conductively with the first connection layer;

wherein the first connection layer comprises an injection layer and a transition layer, the injection layer adjoining the semiconductor body and the transition layer adjoining the carrier; and wherein the protection diode is formed by the transition layer.

* * * * *